(12) United States Patent
Bottarel et al.

(10) Patent No.: US 8,810,302 B2
(45) Date of Patent: Aug. 19, 2014

(54) LOW VOLTAGE ISOLATION SWITCH, IN PARTICULAR FOR A TRANSMISSION CHANNEL FOR ULTRASOUND APPLICATIONS

(75) Inventors: Valeria Bottarel, Novara (IT); Giulio Ricotti, Broni (IT); Silvia Marabelli, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 49 days.

(21) Appl. No.: 13/536,818

(22) Filed: Jun. 28, 2012

(65) Prior Publication Data

US 2012/0313689 A1    Dec. 13, 2012

Related U.S. Application Data

(63) Continuation-in-part of application No. PCT/EP2010/005926, filed on Sep. 29, 2010.

(30) Foreign Application Priority Data

Dec. 30, 2009 (IT) .................................. MI09A2351

(51) Int. Cl.
  *H03K 17/687* (2006.01)
(52) U.S. Cl.
  USPC ............................ 327/365; 327/427; 327/434
(58) Field of Classification Search
  USPC .................. 327/427, 436, 365, 434, 108, 112
  See application file for complete search history.

(56) References Cited

U.S. PATENT DOCUMENTS

| | | | |
|---|---|---|---|
| 6,050,945 A | 4/2000 | Peterson et al. | |
| 6,269,052 B1 | 7/2001 | Oppelt | |
| 8,542,056 B2 * | 9/2013 | Rossi et al. | 327/427 |
| 8,547,161 B1 * | 10/2013 | Dalal et al. | 327/434 |
| 2003/0016072 A1 | 1/2003 | Ramakrishnan | |
| 2005/0154300 A1 | 7/2005 | Wodnicki et al. | |
| 2007/0159229 A1 | 7/2007 | De Haas | |
| 2009/0206676 A1 | 8/2009 | Chu et al. | |

FOREIGN PATENT DOCUMENTS

DE    102004033254 A1    3/2005

* cited by examiner

*Primary Examiner* — Hai L Nguyen
(74) *Attorney, Agent, or Firm* — Seed IP Law Group PLLC

(57) ABSTRACT

A low voltage isolation circuit is coupled between an input terminal for receiving a high voltage signal and an output terminal for transmitting the high voltage signal to a load. The isolation circuit includes a driving block; having a first driving transistor coupled between a first voltage reference and an intermediate node and a second driving transistor coupled between the intermediate node and a second voltage reference; an isolation block connected between the input and output terminals and, through a protection block to the intermediate node. The protection block includes first and second protection transistors (MD1, coupled in anti-series to each other and having control terminals receiving complementary protection driving signals. The isolation block includes a voltage limiter block, a diode block and a control transistor connected across the diode block between the input and output terminals and having a control terminal connected to the intermediate node through the protection block.

22 Claims, 10 Drawing Sheets

LOW VOLTAGE ISOLATION SWITCH, IN PARTICULAR FOR A TRANSMISSION CHANNEL FOR ULTRASOUND APPLICATIONS

BACKGROUND

1. Technical Field

The present disclosure relates to a low voltage switch. The disclosure also relates to a transmission channel of a high voltage signal to a load, in particular a piezoelectric transducer and to a relative driving method. The disclosure particularly, but not exclusively, relates to a low voltage switch for a transmission channel for ultrasound applications and the following description is made with reference to this field of application by way of illustration only.

2. Description of the Related Art

As is well known, sonography or ultrasonography is a system of medical diagnostic testing that uses ultrasonic waves or ultrasounds and is based on the principle of the transmission of the ultrasounds and of the emission of echo and is widely used in the internal medicine, surgical and radiological fields.

The ultrasounds normally used are comprised between 2 and 20 MHz. The frequency is chosen taking into consideration that higher frequencies have a greater image resolving power, but penetrate less in depth in the subject under examination.

These ultrasounds are normally generated by a piezoceramic crystal inserted in a probe maintained in direct contact with the skin of the subject with the interposition of a suitable gel (being suitable for eliminating the air between probe and subject's skin, allowing the ultrasounds to penetrate in the anatomic segment under examination). The same probe is able to collect a return signal or echo, which is suitably processed by a computer and displayed on a monitor.

In particular, the ultrasounds that reach a variation point of the acoustic impedance, and thus for example an internal organ, are partially reflected and the percentage reflected conveys information about the impedance difference between the crossed tissues. It is to be noted that, the big impedance difference between a bone and a tissue being considered, with the sonography it is not possible to see behind a bone, which causes a total reflection of the ultrasounds, while air or gas zones give "shade", causing a partial reflection of the ultrasounds.

The time employed by an ultrasonic wave for carrying out the path of transmission, reflection and return is provided to the computer, which calculates the depth wherefrom the echo has come, thus identifying the division surface between the crossed tissues (corresponding to the variation point of the acoustic impedance and thus to the depth wherefrom the echo comes).

Substantially, an ultrasonographer, in particular a diagnostic apparatus based on the ultrasound sonography, typically comprises three parts:
  a probe comprising at least one transducer, in particular of the ultrasonic type, which transmits and receives an ultrasound signal;
  an electronic system that drives the transducer for the generation of the ultrasound signal or pulse to be transmitted and receives an echo signal of return at the probe of this pulse, processing in consequence the received echo signal; and
  a displaying system of a corresponding sonographic image processed starting from the echo signal received by the probe.

In particular, the word transducer generally indicates an electric or electronic device that converts a type of energy relative to mechanical and physical magnitudes into electric signals. In a broad sense, a transducer is sometimes defined as any device that converts energy from a form to another, so that this one can be re-processed either by men or by other machines. Many transducers are both sensors and actuators. An ultrasonic transducer usually comprises a piezoelectric crystal that is suitably biased for causing its deformation and the generation of the ultrasound signal or pulse.

Ultrasonic transducers for sonography images are usually driven by high voltage driving circuits or drivers able to generate a sinusoidal signal of variable width comprised between 3 and 200Vpp and frequencies in the range 1 MHz to 20 MHz, this sinusoidal signal being a control signal for corresponding generators of the ultrasound pulse to be transmitted, in particular piezoelectric crystals.

The driving of transducers for ultrasonic applications requires in particular the application of high voltage signals (+/−100V) with frequencies in the range of 1 to 6 MHz.

The corresponding driving circuits are thus made of components that can sustain these high voltages and that, given the frequencies at stake, can supply currents high enough to a load applied at the output, in particular an ultrasonic transducer.

As a result, prior art ultrasonic transducer driving circuits use components with rather big sizes. These components however add high parasitic capacitances in parallel to the transducer.

Moreover, the transducer itself is also used for the receiving in a transmission channel for these ultrasound applications. Typically, an ultrasonic transducer transmits a high voltage pulse of the duration of a few us, and receives the echo of this pulse, generated by the reflection on the organs of a subject under examination, for the duration of about 250 us, for going back to the transmission of a new high voltage pulse. For example, a first pulse IM1 and a second pulse IM2 are transmitted with a peak to peak excursion equal, in the example shown, to 190Vpp with reception by the transducer of corresponding echoes indicated with E1 and E2, as schematically shown in FIG. 1.

The echo signal or return acoustic wave is converted into an electric wave that turns out to be a signal of some millivolts of width, signal that is then amplified by low noise amplifier circuits, connected to the transducer itself, in turn disturbed by the parasitic capacitance due to the high voltage components of the driving circuit of the transducer. This reduces the quality of the echo signal.

BRIEF SUMMARY

One embodiment of the present disclosure reduces the effect of the parasitic capacitances of the high voltage components of a driving circuit, in particular for an ultrasonic transducer in a transmission channel for ultrasound applications, and has such structural and functional characteristics as to ensure a correct transmission in this transmission channel of high voltage signals for the transmission of an ultrasonic pulse to an output terminal connected to this transducer, and in the meantime ensures the correct isolation of this terminal at the reception of an echo signal, thus overcoming the limits and/or drawbacks still limiting the systems realized according to the prior art.

One embodiment of the present disclosure uses an isolation switch comprising a real isolation block and at least one suitably driven protection block, this switch being inserted in the transmission channel interposed between the output terminal connected to the ultrasonic transducer and the high voltage components of the driving circuit and being able to transmit or interrupt the flowing of signals, during the transmission of an ultrasonic impulsive signal or when receiving an echo signal in case of ultrasound applications, between an input terminal and an output terminal thereof.

One embodiment of the present disclosure is a low voltage isolation switch electrically coupled between an input terminal suitable for receiving a high voltage signal and an output terminal suitable for transmitting said high voltage signal to a load. The low voltage isolation switch includes at least one driving block electrically coupled between a first and a second voltage reference and comprising a first driving transistor, electrically coupled between said first voltage reference and a first driving central circuit node and a second driving transistor electrically coupled between said driving central circuit node and said second supply voltage reference. The low voltage isolation switch also includes an isolation block connected to the connection terminal, to said input terminal and, through a protection block to said driving central circuit node. The protection block includes first and second protection transistors electrically coupled in anti-series to each other and having control terminals receiving respective complementary protection driving signals. The isolation block includes at least one voltage limiter block, one diode block and one control transistor, in turn connected across said diode block between said input and output terminals of said low voltage isolation switch and having a control terminal connected to said driving central circuit node through said protection block. The diode block includes first and second transmission diodes, connected in antiparallel, i.e., by having an anode terminal of said first diode connected to a cathode terminal of said second diode and vice versa.

More in particular, the disclosure comprises the following supplementary and optional features, taken alone or in combination, if needed.

According to one embodiment of the disclosure, said voltage limiting block can comprise at least one first and one second voltage limiter circuit connected between a first and a second inner circuit node, said first inner circuit node being connected, through said protection block, to said driving central circuit node and said second inner circuit node being connected to said first output terminal.

In particular, according one embodiment of the disclosure, said first transmission diode can have a cathode terminal connected to said connection terminal and an anode terminal connected to said second inner circuit node and said second transmission diode has an anode terminal connected to said connection terminal and a cathode terminal connected to said second inner circuit node.

According to one embodiment of the disclosure, said control transistor can have said control terminal connected to said first inner circuit node.

Furthermore, according to one embodiment of the disclosure, said control transistor can be a low voltage diode-configured N channel MOS transistor.

According to one embodiment of the disclosure, said protection block can comprise a first and a second protection transistor, inserted in series to each other, between said driving central circuit node and said first inner circuit node.

In particular, according one embodiment of the disclosure, said first protection transistor can have a control terminal receiving a first protection driving signal and said protection transistor can have a control terminal receiving a second protection driving signal.

Furthermore, also according to one embodiment of the disclosure, said first protection transistor can be an N channel MOS transistor and said second protection transistor can be a P channel MOS transistor.

Moreover, according to one embodiment of the disclosure, said first driving transistor of said driving block can have a control terminal receiving a first driving signal and said second driving transistor has a control terminal connected to a level shifter with function of inversion, receiving in turn a second driving signal and being suitable for supplying said second driving transistor with an inverted driving signal.

One embodiment of the present disclosure is a transmission channel for transmitting a high voltage signal from an input terminal via a connection terminal to a load. The transmission channel includes at least one matrix of high voltage switches electrically coupled between said input terminal and a high voltage output terminal, as well as a second low voltage output terminal connected to a transconductance cell and a transmission switch connected between a connection terminal and said low voltage output terminal. The transmission channel includes a low voltage isolation switch realized as above indicated and having an input terminal connected to said first output terminal and an output terminal connected to said connection terminal.

According to one embodiment of the disclosure, said transmission channel can be used for the transmission of an ultrasound pulse as high voltage signal, said load being a piezoelectric transducer.

One embodiment of the present disclosure is a driving method for driving a transmission channel as above described. The method includes transmitting said high voltage signal via the connection terminal to said load, in which said matrix of switches is turned on, said transmission switch is switched off and said high voltage signal is transmitted through said low voltage isolation switch, thanks in particular to said diode block and to said protection block suitably switched off. In one embodiment, the method includes a first receiving mode in which an echo signal is received through said transmission switch while said matrix of switches and said low voltage isolation switch, and in particular said protection block are off, said echo signal flowing from said connection terminal towards said second output terminal and then to said transconductance cell. In one embodiment, the method includes a second receiving mode in which an echo signal is received at a connection terminal and transmitted through the isolation switch and said matrix of switches, and in which said matrix of switches and said low voltage isolation switch are on and said transmission switch is switched off, said echo signal flowing from said connection terminal towards said first output terminal and then to said input terminal.

According to one embodiment of the disclosure, during said transmission step, said protection block can be switched off, said first protection driving signal being brought to a low value and said second protection driving signal being brought to a positive low supply voltage value and/or left floating, a high voltage signal on said first inner circuit node can be blocked by said protection block, said control terminal of said control transistor being left floating.

In particular, according to one embodiment of the disclosure, during said transmission step, said first driving signal can be at a positive low supply voltage value, said second driving signal can be at said positive low supply voltage value and said inverted driving signal can be at a negative low supply voltage value.

Furthermore, according to one embodiment of the disclosure, during said first receiving mode, said protection block can be on, said first protection driving signal being brought to a low value, said second protection driving signal being brought to a negative supply voltage value twice as much as the negative low supply voltage value so as to bring said control terminal of said control transistor to a negative low supply voltage value.

According to one embodiment of the disclosure, during said first receiving mode, said first driving signal can be brought to said positive low supply voltage value, said second driving signal and said inverted driving signal being brought to said low value.

According to one embodiment of the disclosure, during said second receiving mode, said control transistor and said protection block can be turned on, said first driving transistor can be turned on and said second driving transistor can be switched off while said transmission switch can be kept open so that said echo signal can reach said matrix of switches through said control transistor, having said control terminal at a positive low supply value.

Furthermore, according to one embodiment of the disclosure, during said second receiving mode, said first protection driving signal can be brought to a positive supply voltage value being twice as much as said positive low supply voltage value and said second protection driving signal can be brought to said low value.

Finally, according to one embodiment of the disclosure, during said second receiving step, said first driving signal can be brought to said low value, said second driving signal can be brought to said positive low supply voltage value and said inverted driving signal can be brought to said negative low supply voltage value.

The characteristics and the advantages of the low voltage isolation switch, of the transmission channel and of the driving method according to the disclosure will be apparent form the following description of an embodiment thereof given by way of indicative and non-limiting example with reference to the annexed drawings.

DETAILED DESCRIPTION

Figure 1:
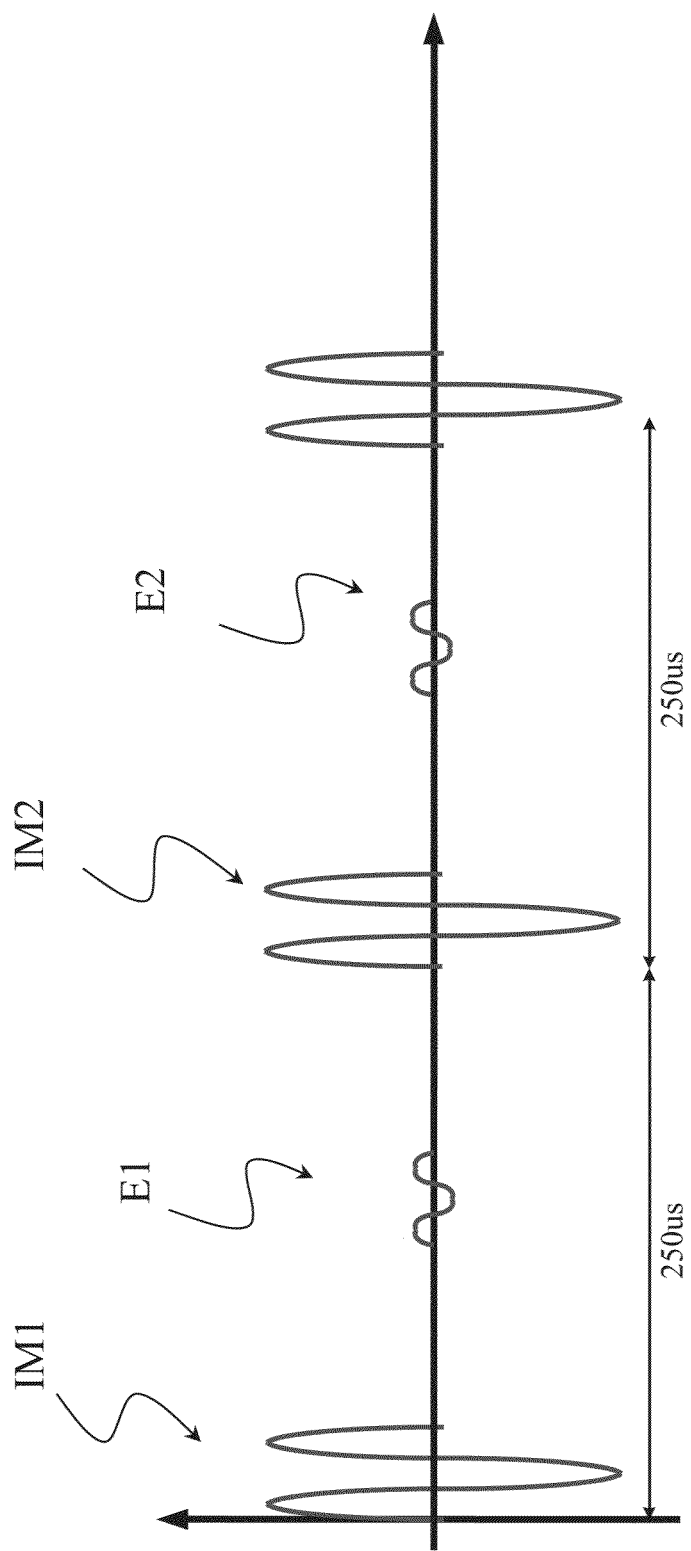
FIG. 1 schematically shows a first and a second ultrasound pulse being generated by a driving circuit and thereby applied to an ultrasonic transducer according to the prior art.

With reference to these figures, and in particular to FIGS. 2A, 2B and 2C, 10 globally and schematically indicates a transmission channel of an impulsive signal for an ultrasound transducer, in particular a piezoelectric transducer PZ.

By way of illustration, only an output section of the transmission channel 10 has been actually shown being connected to the piezoelectric transducer PZ and supplying it with an impulsive signal IM generated by suitable circuitry (not shown) and already on an input terminal IN of the transmission channel 10.

In particular, the transmission channel 10 first of all comprises a matrix (MATRIXsw) 2 of high voltage switches electrically coupled between the input terminal IN and a first high voltage output terminal HVout, whereto the input impulsive signal IM is transmitted.

Furthermore, the transmission channel 10 comprises a second low voltage output terminal LVout connected to a transconductance cell 4 (LNA) and via the connection terminal pzt to a piezoelectric transducer PZ. Finally, the transmission channel 10 comprises at least one transmission switch 3 (TRsw) connected between the connection terminal and the second output terminal LVout.

According to an embodiment of the disclosure, the transmission channel 10 also comprises an isolation switch 1 (ISOsw), in particular a low voltage switch, electrically coupled between the first output terminal HVout and the connection terminal pzt. In this way, the first output terminal HVout is connected to the second output terminal LVout through the series of the low voltage isolation switch 1 and of the transmission switch 3.

The use of the low voltage isolation switch 1 allows to overcome the problem of the high parasitic capacitance due to the high voltage components of the matrix 2 of switches. In particular, as it will be clarified hereafter in the description, this low voltage isolation switch 1 comprises a suitably driven protection block 9 configured to transmit or interrupt the transmission of signals, during the transmission of an ultrasonic impulsive signal IM or when receiving an echo signal E towards a real isolation block 8, in turn comprising at least one voltage limiter block 6 and a diode block 7, as well as a control transistor MD.

Figure 2A:
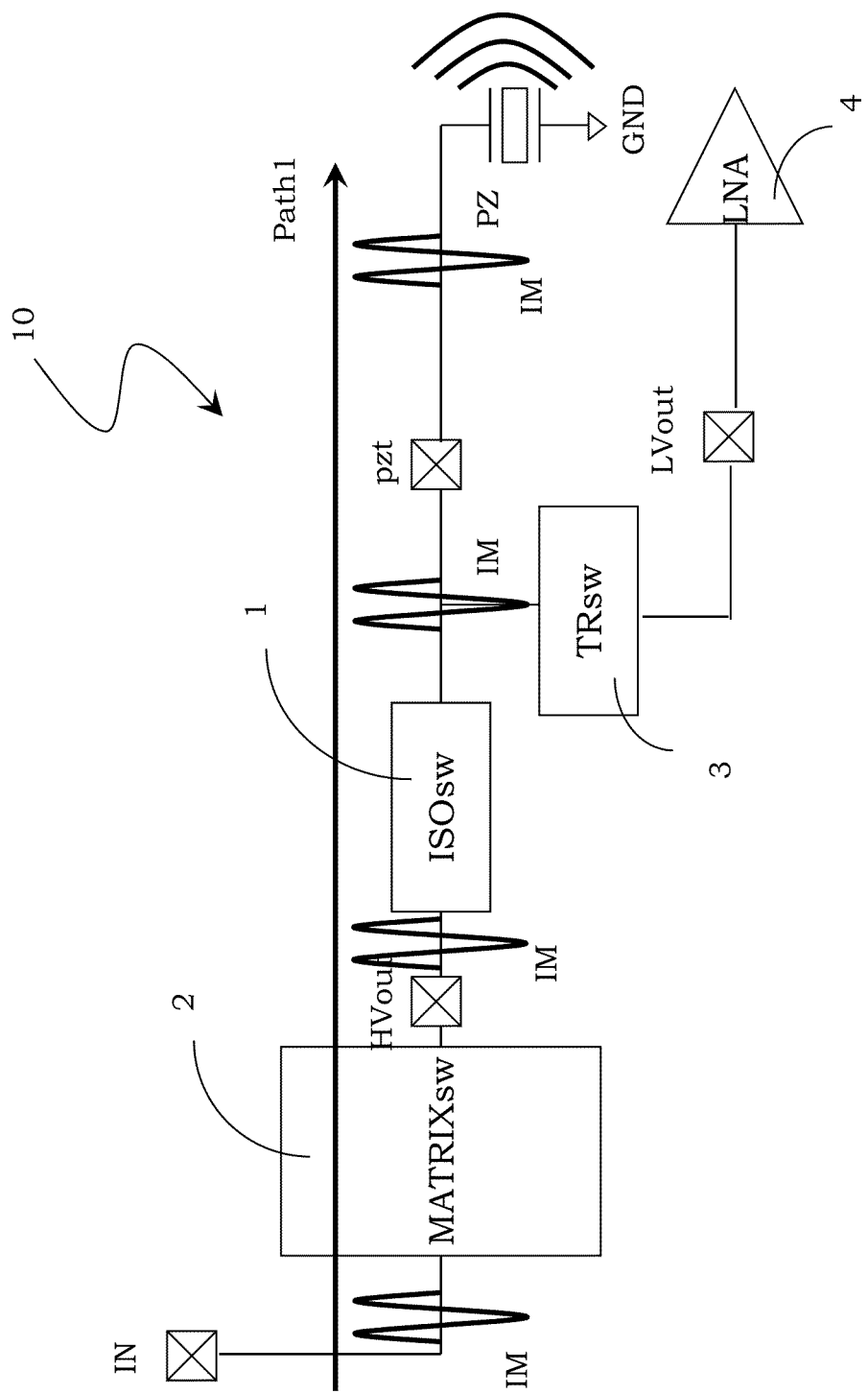
FIGS. 2A-2C schematically show a transmission channel for ultrasound applications realized according to the disclosure, according to a first, a second and a third working condition, respectively.

According to a first working condition, in particular of transmission of a pulse IM to the connection terminal pzt to the piezoelectric transducer PZ, as shown in FIG. 2A according to the path indicated as Path1, the matrix 2 of switches is turned on for transmitting this pulse IM from the input terminal IN towards the first output terminal HVout. Moreover, the transmission switch 3 is off and the pulse IM is transmitted through the low voltage isolation switch 1, thanks to the presence within the low voltage isolation switch 1 of the diode block 7 connected to the connection terminal pzt and to the protection block 9 which is suitably on, as it will be explained hereafter in the description.

Figure 2B:
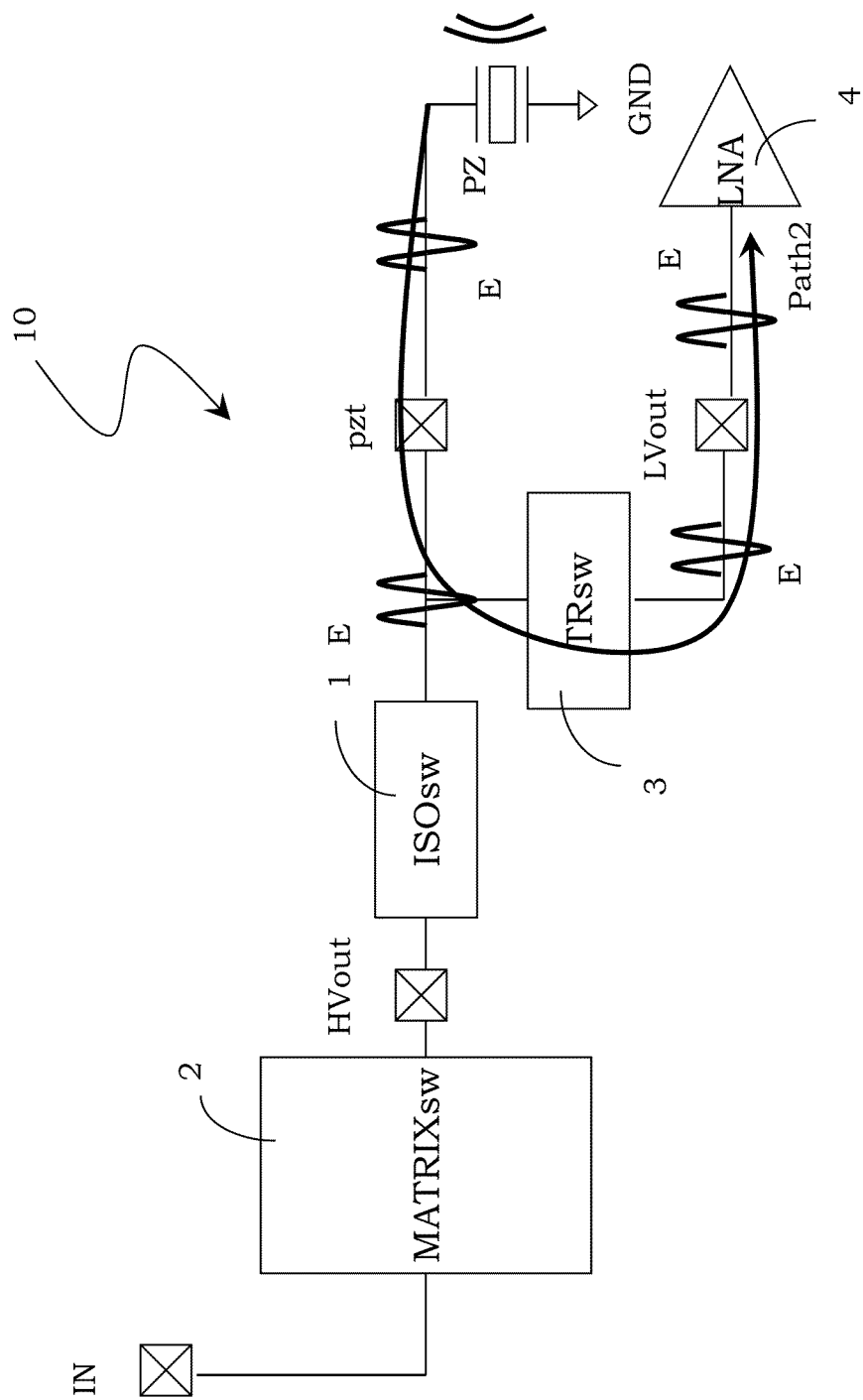

According to a second working condition, in particular when receiving an echo signal E through the transmission switch 3, as shown in FIG. 2B according to the path indicated as Path2, the matrix 2 of switches and the low voltage isolation switch 1 are off and the transmission switch 3 is turned on, the echo signal E flowing from the connection terminal pzt towards the second output terminal LVout, through the transmission switch 3, and then to the trans conductance cell 4.

Figure 2C:
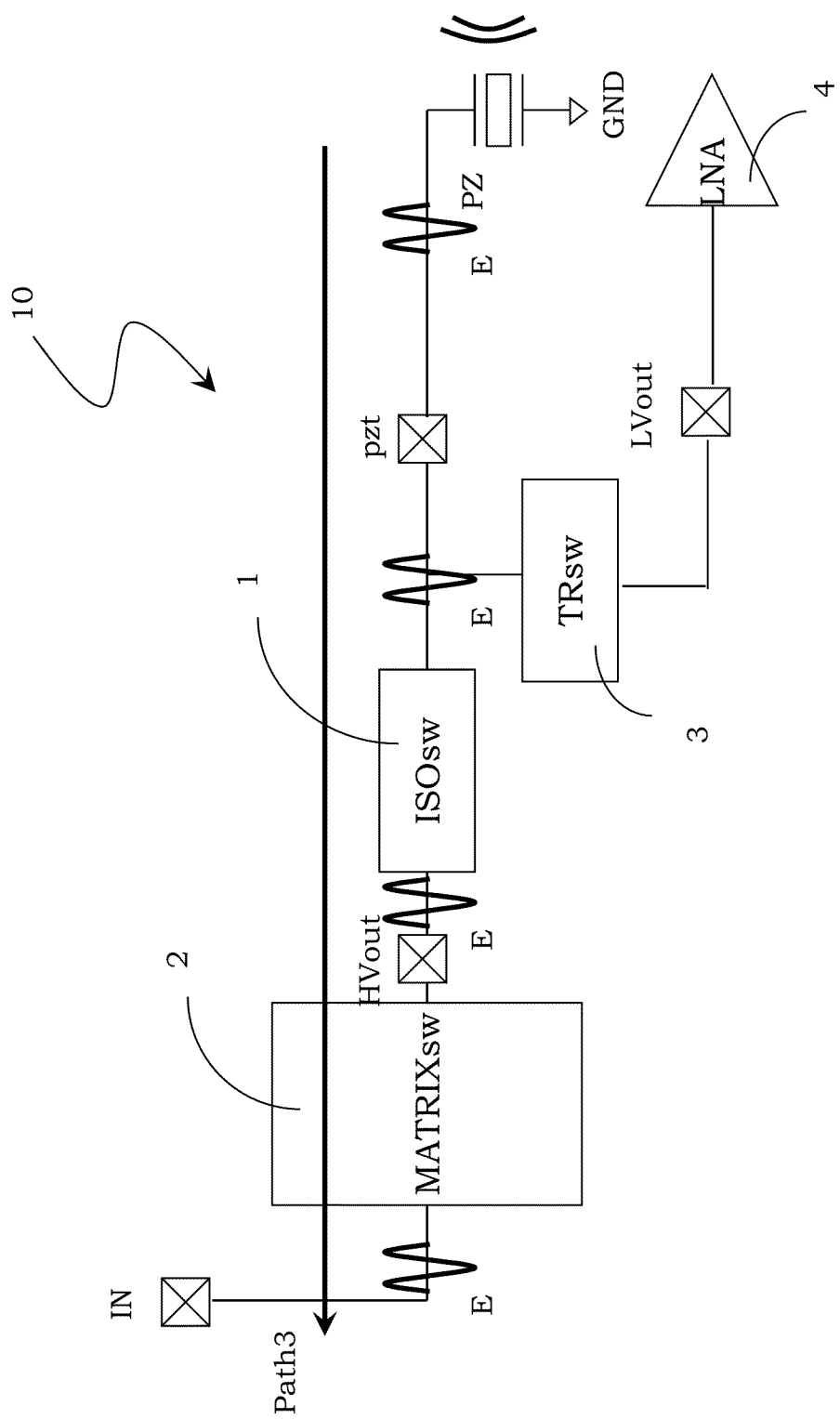

Finally, according to a third working condition, in particular when receiving an echo signal E through the matrix 2 of switches, as shown in FIG. 2C according to the path indicated as Path3, the matrix 2 of switches and the low voltage isolation switch 1 are on and the transmission switch 3 is switched off, the echo signal E flowing from the connection terminal pzt to the piezoelectric transducer PZ towards the first output terminal HVout and then to the input terminal IN.

Figure 3:
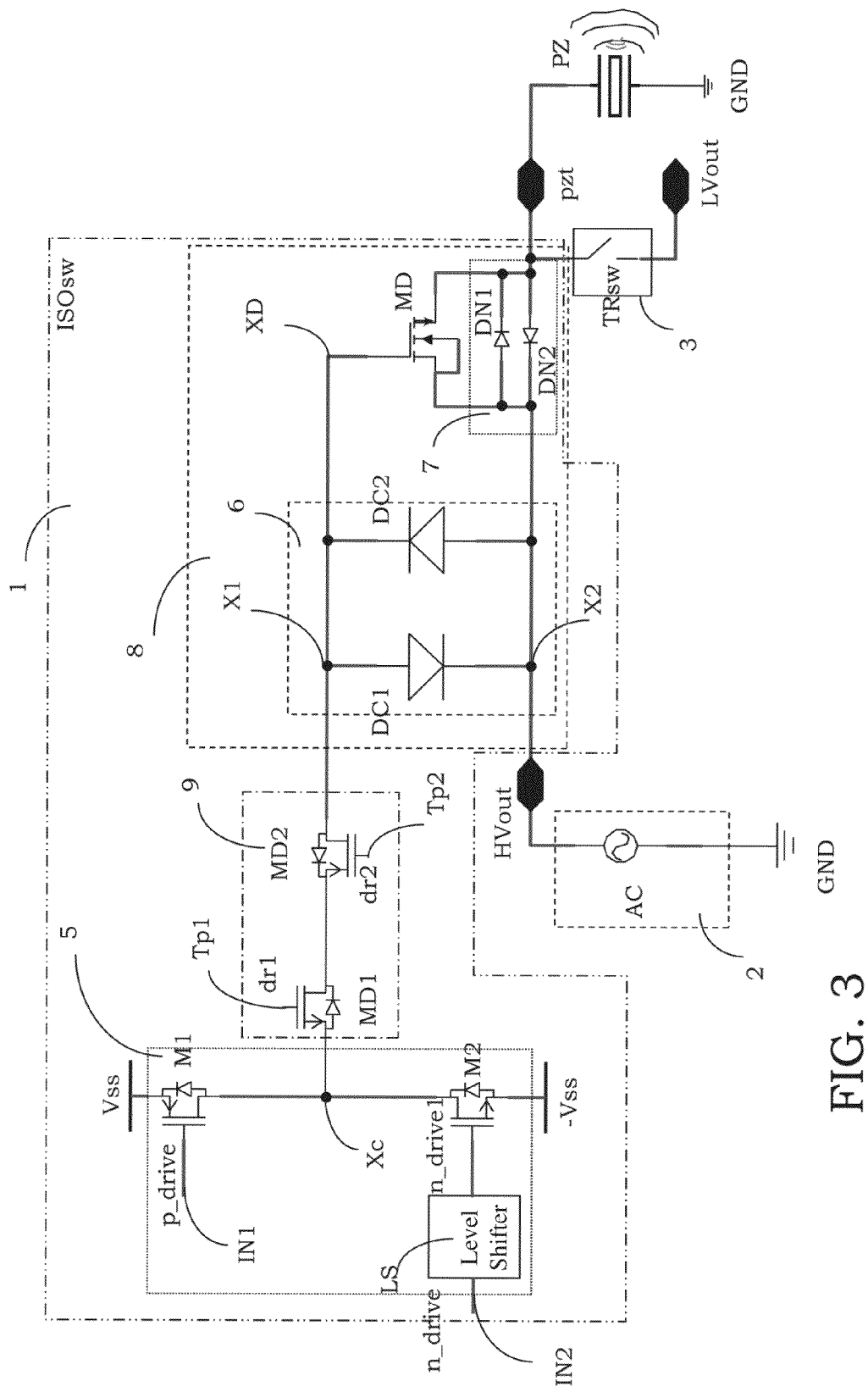
FIG. 3 schematically shows a low voltage switch realized according to the disclosure.

The low voltage isolation switch 1 according to the disclosure is shown in greater detail in FIG. 3.

In particular, by way of illustration, in this FIG. 3, the matrix 2 of switches is simply indicated as a high voltage block AC connected to the first output terminal HVout.

The first output terminal HVout of the matrix 2 of switches is an input terminal of the low voltage isolation switch 1 suitable for receiving a high voltage signal, while the connection terminal pzt is an output terminal of the low voltage isolation switch 1 suitable for transmitting this high voltage signal to a load, in particular the piezoelectric transducer PZ.

The low voltage isolation switch 1 comprises a driving block 5 electrically coupled between a first and a second voltage reference, respectively a positive power supply Vss and a negative power supply −Vss, and comprises a first driving transistor M1 electrically coupled between the positive supply voltage reference Vss and a first driving central circuit node Xc and having a control or gate terminal connected to a first input terminal IN1 of the driving block 5 and receiving a first driving signal, p_drive.

The driving block 5 also comprises a second driving transistor M2 electrically coupled between the driving central circuit node Xc and the negative supply voltage reference −Vss and having a control or gate terminal connected to a level shifter LS (LEVEL SHIFTER) in turn connected to a second input terminal IN2 of the driving block 5 and receiving a second driving signal, n_drive. The level shifter LS also has an inversion function that allows to transform a positive supply voltage value into a negative supply voltage value, leaving a value of 0V corresponding to the ground unaltered and supplying the control terminal of the second driving transistor M2 with an inverted driving signal n_drive1.

In the embodiment of FIG. 3, the first driving transistor M1 is a P channel MOS transistor, while the second driving transistor M2 is an N channel MOS transistor. These driving transistors are low voltage transistors supplied by low supply voltage references, Vss and −Vss, in particular equal to 3.3V.

According to an embodiment of the disclosure, the low voltage isolation switch 1 comprises an isolation block 8 connected to the connection terminal pzt and to the first output terminal HVout, as well as to the driving central circuit node Xc through a protection block 9.

The isolation block 8 comprises a voltage limiter block 6, a diode block 7 and a control transistor MD having a control or gate terminal XD.

In particular, the voltage limiter block 6 comprises at least one first DC1 and one second voltage limiter circuit DC2 schematized as diodes connected in antiparallel, i.e., by having the anode terminal of the first diode connected to the cathode terminal of the second one and vice versa, between a first X1 and a second inner circuit node X2. More in particular, the first inner circuit node X1 is connected, through the protection block 9, to the driving central circuit node Xc, as well as to the control terminal XD of the control transistor MD, while the second inner circuit node X2 is connected to the first output terminal HVout.

These voltage limiter circuits, DC1 and DC2, limit the voltage between the gate and source terminals (Vgs) of the control transistor MD and prevent that the control transistor from being damaged due to too high values of this voltage.

It is possible to realize these voltage limiter circuits, for example, through a series of diodes or other equivalent structures, even more complex, that can also be realized with transistors.

In the case of diodes, that have maximum voltage equal to 0.7V in pass condition, it will be possible to use the series of five diodes (5*0.7V=3.5V) for protecting a control transistor MD of class 3.3V, for example.

Moreover, the diode block 7 comprises at least one first DN1 and one second transmission diode DN2, connected in antiparallel, i.e., by having the anode terminal of the first diode connected to the cathode terminal of the second and vice versa, between this connection terminal pzt and the second inner circuit node X2. In the example of the figure, the first transmission diode DN1 has the cathode terminal connected to the connection terminal pzt and the anode terminal connected to the second inner circuit node X2, while the second transmission diode DN2 has the anode terminal connected to the connection terminal pzt and the cathode terminal connected to the second inner circuit node X2.

The control transistor MD is connected to the ends of the diode block 7 and has the control terminal XD connected to the first inner circuit node X1.

In the example of the figure, the control transistor MD is a low voltage diode-configured N channel MOS transistor.

According to an embodiment of the disclosure, the protection block 9 comprises a first MD1 and a second protection transistor MD2 electrically coupled in series to each other, between the driving central circuit node Xc and the first inner circuit node X1.

In particular, the first protection transistor MD1 is an N channel MOS transistor and has a control or gate terminal Tp1 receiving a first protection driving signal dr1, while the second protection transistor MD2 is a P channel MOS transistor and has a control or gate terminal Tp2 receiving a second protection driving signal dr2. The protection transistors MD1 and MD2 are thus connected in anti-series to each other by having the respective equivalent or body diodes in anti-series and have control terminals receiving respective complementary protection driving signals, dr1 and dr2, respectively.

Figure 4A:
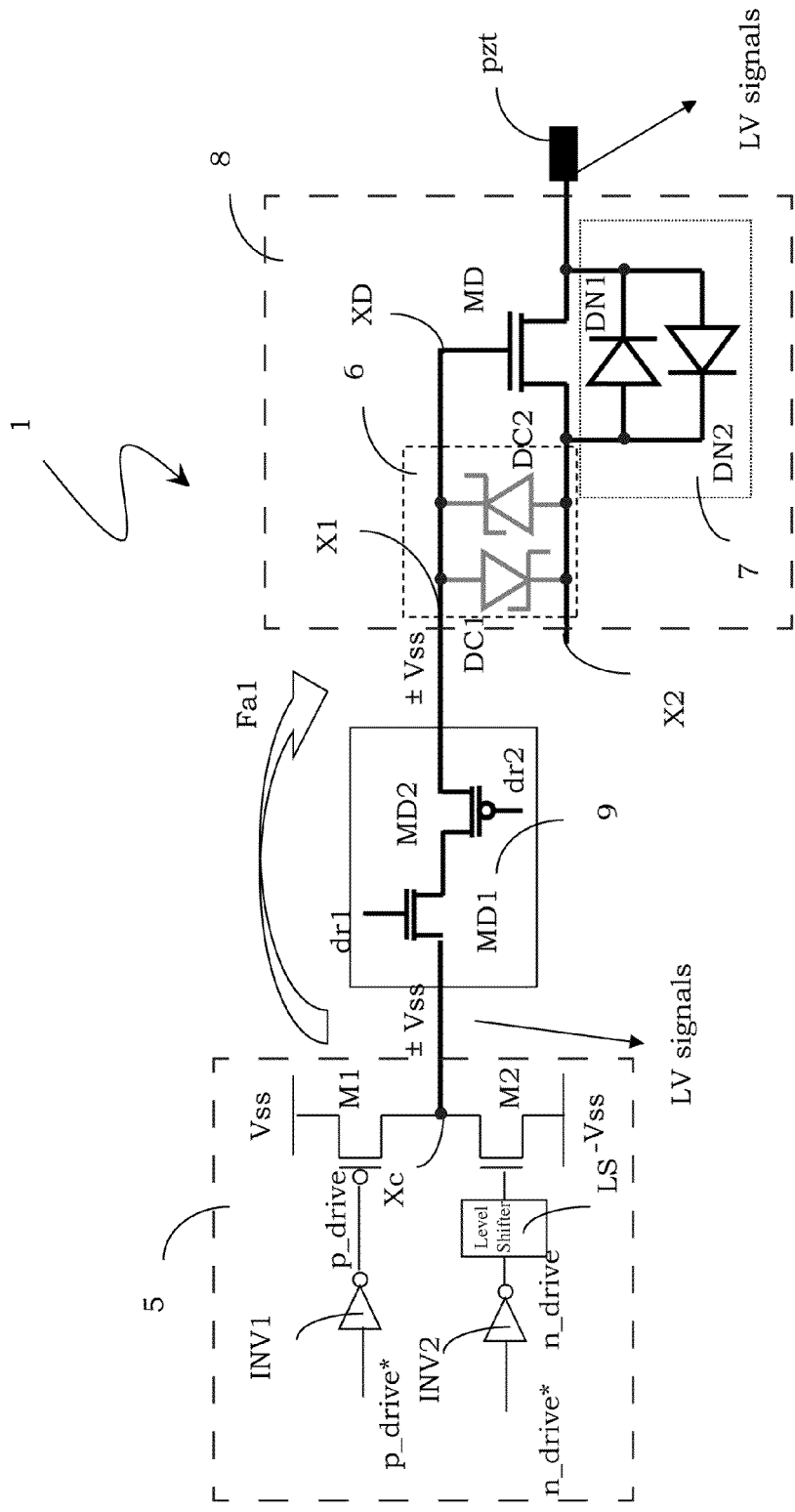
FIGS. 4A and 4B schematically show the working of the switch of FIG. 3 according to different conditions of a protection block contained therein.

According to an embodiment of the disclosure, as schematically shown in FIG. 4A and indicated with the arrow Fa1, the turn-on of the protection block 9 allows the transfer from the driving central circuit node Xc to the first inner circuit node X1 of low voltage signals (LV signals), with values comprised between the first and the second low supply voltage reference, Vss and −Vss, and the isolation block 8 allows the passage of the LV signals to the connection terminal pzt.

In particular, this FIG. 4A shows the two receiving steps of an echo, in which a low voltage signal (LV signal) arrives from the connection terminal pzt. In this case, the low voltage driving voltage on the driving central circuit node Xc is brought back through the protection block 9 to the control or gate terminal of the control transistor MD (node XD).

Figure 4B:
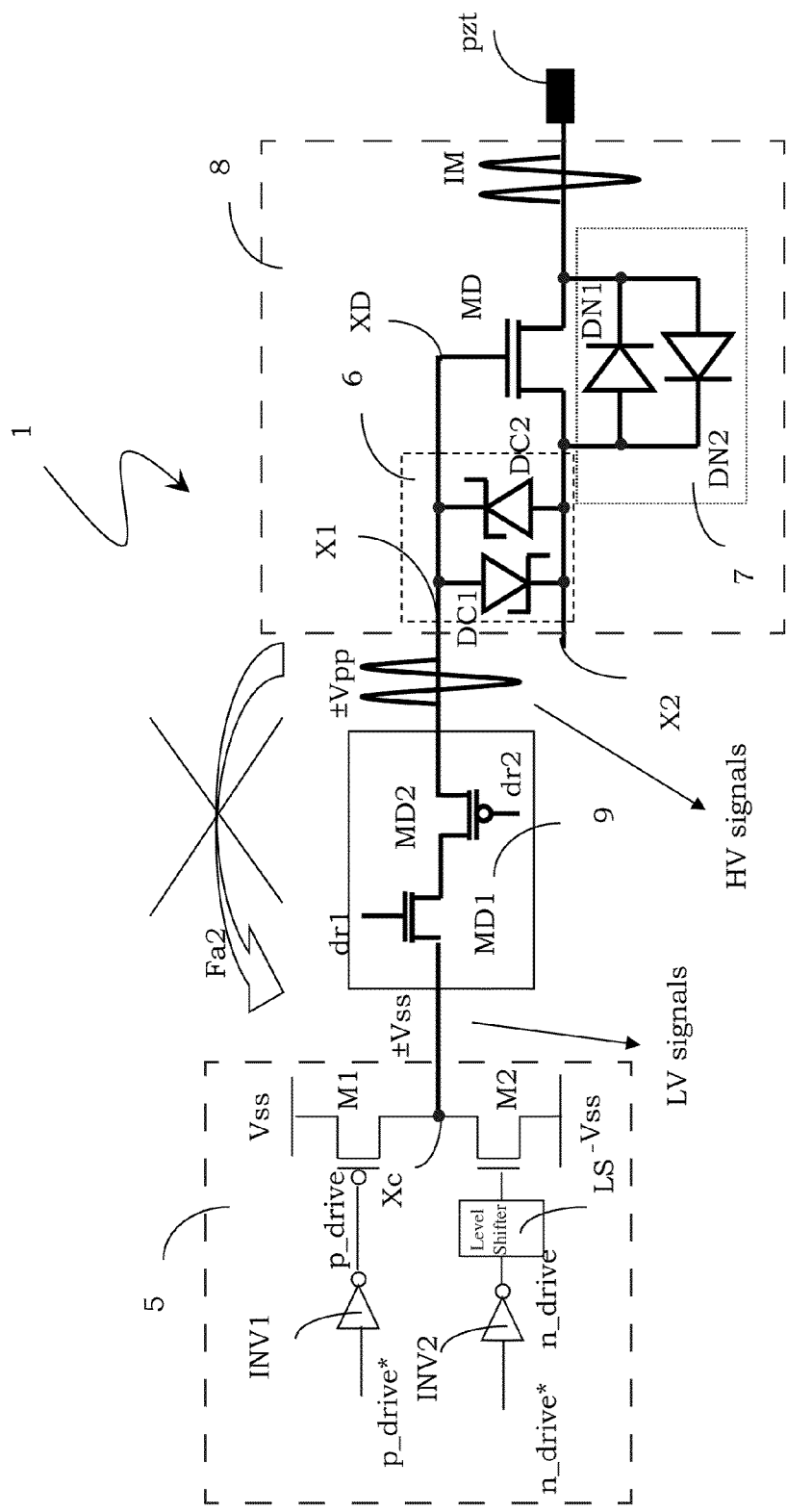

In a dual way, as schematically shown in FIG. 4B and indicated with the arrow Fa2, the switching off of the protection block 9 prevents the passage towards the driving central circuit node Xc of high voltage signals (HV signals), with values comprised between a first and a second high supply voltage reference Vpp and −Vpp, on the first inner circuit node X1, coming from the connection terminal pzt through the isolation block 8.

This FIG. 4B in fact shows the transmission step of the pulses, with a high voltage signal (HV signal) that goes towards the connection terminal pzt. In this step, the node XD corresponding to the gate terminal of the control transistor MD moves like the high voltage signal (with values between +/−Vpp), while the driving central circuit node Xc is floating, and the transistors of the protection block 9 are kept off, which enables the protection block to protect the driving block 5 since it does not let this high voltage signal to flow to the node XD.

Figure 5A:
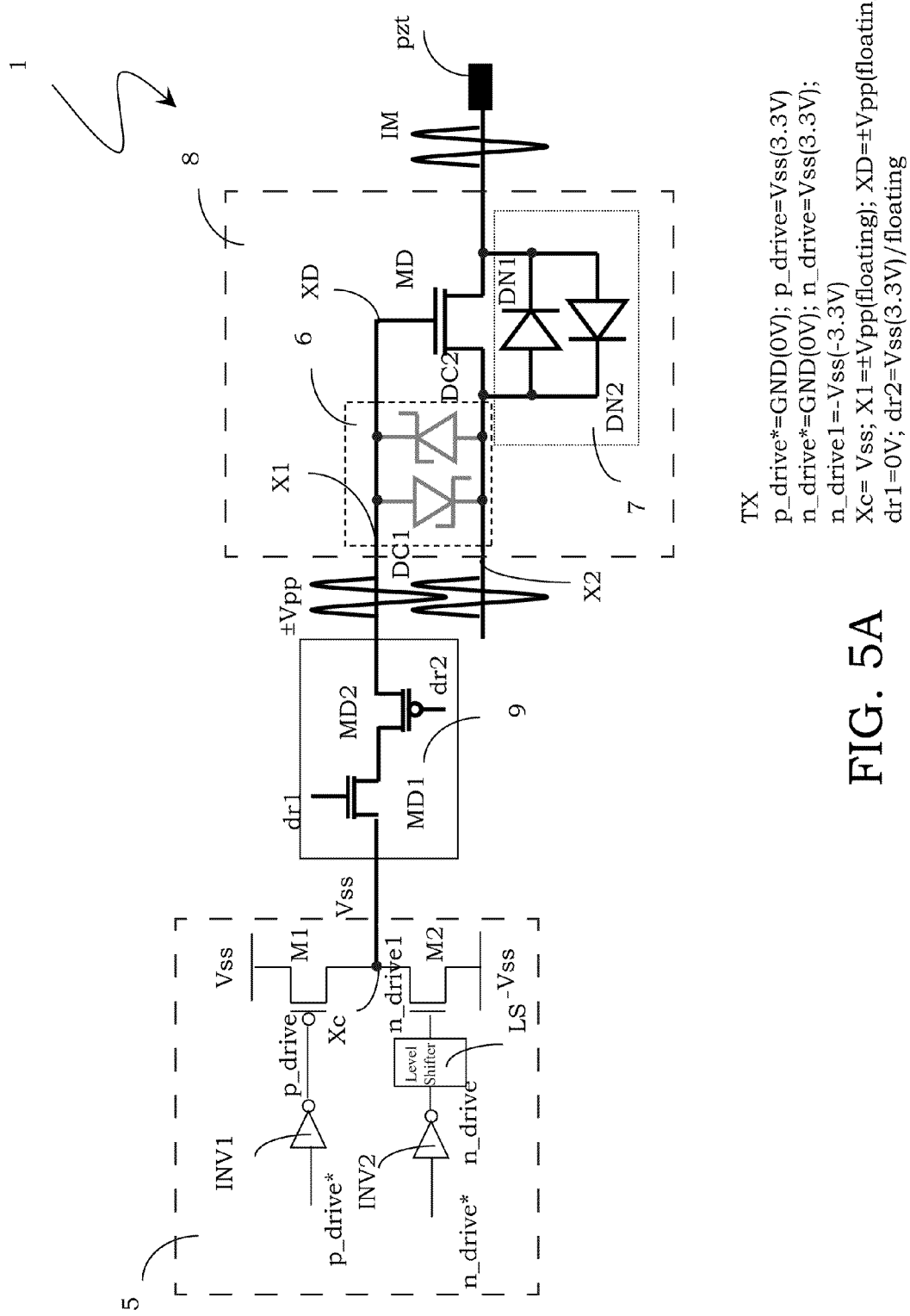
FIGS. 5A-5C schematically show the working of the switch of FIG. 3 according to the conditions corresponding to FIGS. 2A-2C.
Figure 5B:
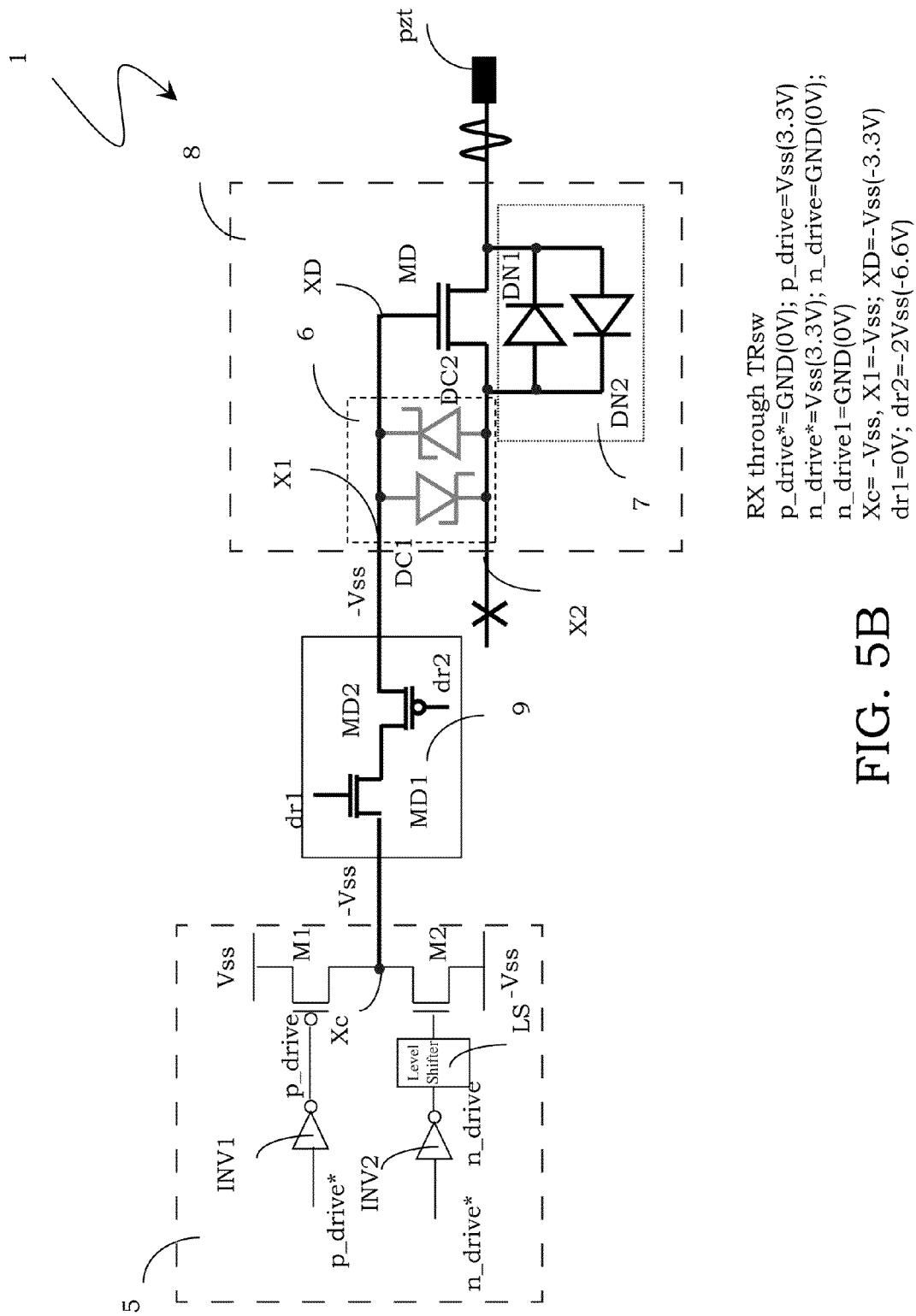
Figure 5C:
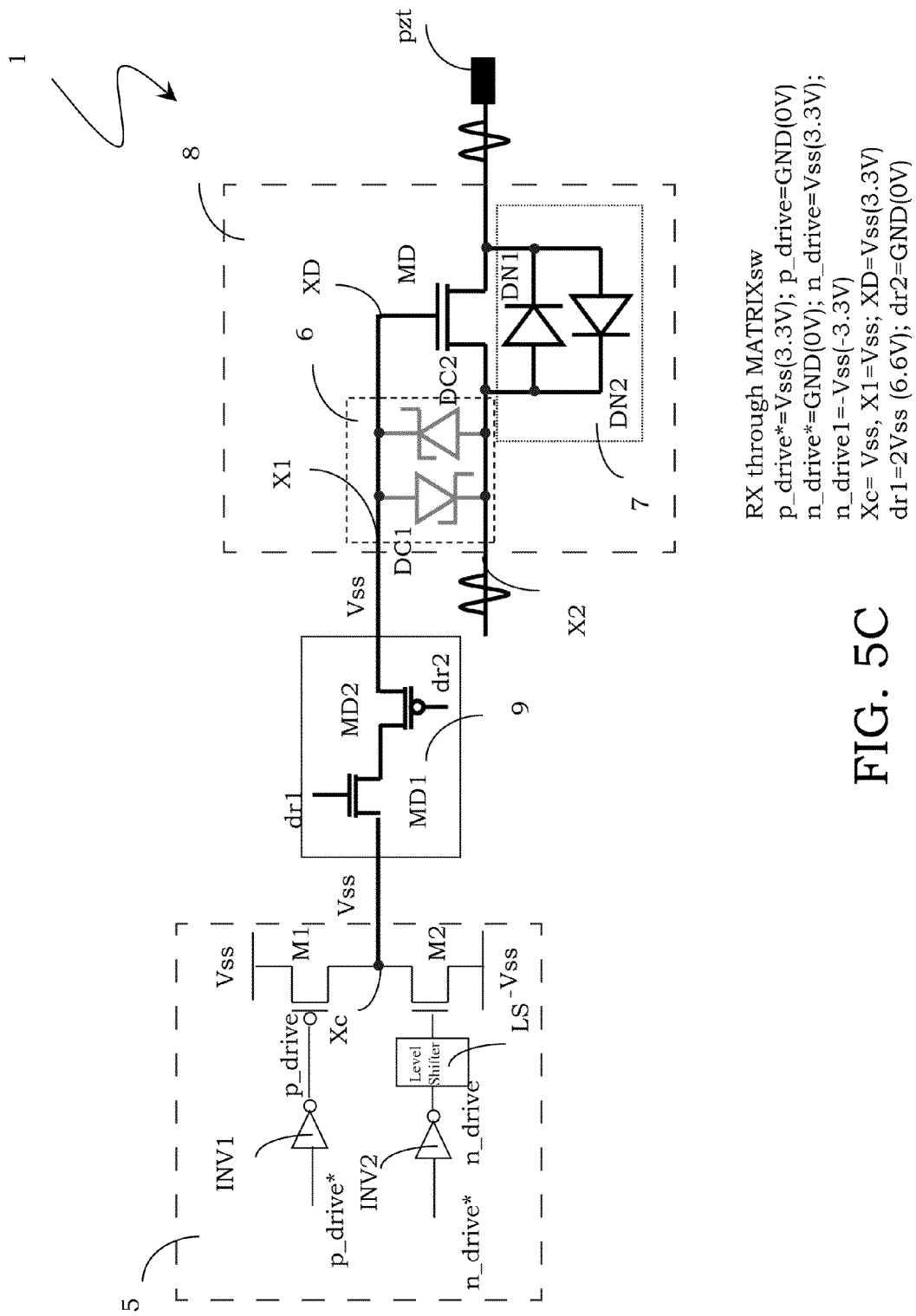

More in detail, the working principle of the low voltage isolation switch 1 is shown in FIGS. 5A-5C, corresponding to the working conditions already described with reference to FIGS. 2A-2C.

According to the first working condition, shown in FIG. 5A, in particular of transmission, a high voltage pulse IM is on the first output terminal HVout (and thus on the second inner circuit node X2) and should be transferred towards the connection terminal pzt to the piezoelectric transducer PZ without jeopardizing the driving block 5, which is a low voltage circuit.

According to an embodiment of the disclosure, the transistors MD1, MD2 of the protection block 9 are switched off by bringing the first protection driving signal dr1 to a low value corresponding to a ground voltage reference GND (0V), and bringing the second protection driving signal dr2 to a positive low supply voltage value Vss (3.3V) and/or left floating.

It is to be noted that according to this condition, the two body-drain diodes of the MOS transistors MD1 and MD2 remain available to intervene in the working dynamics. In practice, the protection block 9 protects when off.

In this way, on the driving central circuit node Xc a positive low supply voltage signal Vss (3.3V) is present, the high voltage signal on the first inner circuit node X1 being blocked by the protection block 9.

According to this first working condition, the first driving signal p_drive is at a ground voltage reference GND (0V), the second driving signal n_drive being at the positive low supply voltage value Vss (3.3V), the inverted driving signal n_drive1 thus being at a negative low supply voltage value −Vss (−3.3V), the control terminal XD of the control transistor MD being left floating, being in the transmission step of the high voltage signal.

In the example of the figure, the driving block 5 also comprises a first and a second input inverter, INV1 and INV2, connected to the first and to the second input terminal, IN1 and IN2, and receiving negated values, p_drive* and n_drive*, of the first and of the second driving signal, p_drive and n_drive.

It is to be noted that for ultrasound applications, the high voltage pulse applied to the first output terminal HVout has high peak to peak values (~200V) and high slopes (~5V/ns), with the risk of breaking the gate oxide of the transistors of the driving block 5, that are low voltage elements. The protection block 9 prevents the flowing of this high voltage pulse towards the driving block 5 and ensures its integrity, in particular avoiding possible damages of the transistors M1 and M2.

In fact, as already previously indicated, during the transmission step, the connection terminal pzt moves between +/−Vpp (for example between +/−100V). For preserving the control transistor MD, the gate terminal XD of this transistor moves in the same way. However, these oscillations of the node XD could damage the transistors M1 and M2 of the driving block 5. To this aim, the protection block 9 is interposed, which prevents the transmission of high voltage signals that could damage the driving block 5.

According to the second working condition, shown in FIG. 5B, in particular when receiving an echo signal through the transmission switch 3, the control transistor MD allows to isolate the matrix 2 of switches and thus to reduce the parasitic capacitive load seen by the piezoelectric transducer PZ. In this case, the control transistor MD is then switched off prior to the arrival of this echo signal.

According to an embodiment of the disclosure, the protection block 9 is turned on by bringing the driving central circuit node Xc to −Vss, turning on the transistor MD1 by bringing the first protection driving signal dr1 to a low value corresponding to a ground voltage reference GND (0V), turning on the transistor MD2 by bringing the second protection driving signal dr2 to a negative supply voltage value that is twice as much as the negative low supply voltage value −2Vss (−6.6V) so as to bring the control terminal XD of the control transistor MD to a negative low supply voltage value −Vss. The driving central circuit node Xc is brought to −Vss by bringing the first driving signal p_drive to at a positive low supply voltage value Vss (3.3V) while the inverted second driving signal n_drive1 is at a ground value GND (0V).

According to the third working condition, shown in FIG. 5C, in particular when receiving an echo signal through the matrix 2 of switches, the control transistor MD is turned on as is the protection block 9. In particular, the first driving transistor M1 is turned on and the second driving transistor M2 is turned off while the transmission switch 3 is kept open. The echo signal thus reaches the matrix 2 of switches exactly through the control transistor MD. In this case, the first driving signal p_drive is brought to the ground value GND (0V) while the second driving signal n_drive is brought to the positive low supply voltage value Vss (3.3V), the inverted driving signal n_drive1 being then brought to the negative supply voltage value −Vss (−3.3V).

According to an embodiment of the disclosure, the protection block 9 is turned on by turning on the transistor MD1 by bringing the first protection driving signal dr1 to a positive supply voltage value that is twice as much as the positive low supply voltage value Vss (2Vss=6.6V) and turning on the transistor MD2 by bringing the second protection driving signal dr2 to the ground value GND (0V).

In conclusion, the low voltage switch as described is able to transmit high voltage signals (for example at +/−100V) or to isolate, when open, a connection terminal to a piezoelectric transducer, ensuring in this way a high immunity against the capacitive couplings of a corresponding input signal, ensuring at the same time a correct working of the transmission channel that comprises it according to all its working conditions.

In particular, thanks to the presence of the protection block 9, it is possible to realize the driving block with low voltage elements and without the need of introducing diodes.

Obviously, a technician of the field, with the aim of meeting incidental and specific needs, will be allowed to introduce several modifications and variations to the above described circuit, all within the scope of protection of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A low voltage isolation switch, comprising
an input terminal configured to receive a high voltage signal;
an output terminal configured to transmit said high voltage signal to a load;
first and second voltage reference terminals configured to receive first and second voltage references, respectively;
a driving block electrically coupled between the first and second voltage reference terminals and including:
a first driving transistor electrically coupled between said first voltage reference terminal and an intermediate node; and
a second driving transistor electrically coupled between said intermediate node and said second supply voltage reference terminal;
a protection block;

an isolation block electrically coupled between the protection block and the output terminal and electrically coupled by the protection block to the intermediate node, the isolation block including:
- a diode block electrically coupled between said input and output terminals;
- a control transistor electrically coupled across said diode block and having a control terminal electrically coupled to said intermediate node by said protection block; and
- a voltage limiter block coupled between the input terminal and the control terminal of the control transistor.

2. The low voltage isolation switch according to claim 1, wherein said voltage limiter block comprises a first and second voltage limiters electrically coupled between the input terminal and the control terminal of the control transistor.

3. The low voltage isolation switch according to claim 1, wherein said diode block includes a first transmission diode having a cathode terminal electrically coupled to said output terminal and an anode terminal electrically coupled to said input terminal and a second transmission diode having an anode terminal electrically coupled to said output terminal and a cathode terminal electrically coupled to said input terminal.

4. The low voltage isolation switch according to claim 1, wherein said control transistor is a low voltage diode-configured N channel MOS transistor.

5. The low voltage isolation switch according to claim 1, wherein said protection block includes:
- a first protection transistor having a control terminal configured to receive a first protection driving signal; and
- a second protection transistor electrically coupled in anti-series with the first protection transistor and having a control terminal configured to receive a second protection driving signal.

6. The low voltage isolation switch according to claim 1, wherein said protection block includes an N channel MOS transistor and a P channel MOS transistor electrically coupled in anti-series with each other.

7. The low voltage isolation switch according to claim 1, wherein:
- said driving block includes an inverting level shifter configured to produce an inverted first driving signal by inverting a first driving signal;
- said first driving transistor of said driving block has a control terminal configured to receive the inverted first driving signal; and
- said second driving transistor has a control terminal configured to receive a second driving signal.

8. A transmission channel, comprising:
- an input terminal configured to receive a high voltage signal;
- a connection terminal configured to transmit the high voltage signal to a load
- a high voltage terminal;
- a matrix of high voltage switches electrically coupled between said input terminal and the high voltage terminal; and
- a low voltage isolation switch that includes:
  - an input terminal electrically coupled to said high voltage terminal;
  - an output terminal electrically coupled to said connection terminal;
  - first and second voltage reference terminals configured to receive first and second voltage references, respectively;
  - a driving block electrically coupled between the first and second voltage reference terminals and including:
    - a first driving transistor electrically coupled between said first voltage reference terminal and an intermediate node; and
    - a second driving transistor electrically coupled between said intermediate node and said second supply voltage reference terminal;
  - a protection block;
  - an isolation block electrically coupled between the protection block and the output terminal of the low voltage isolation switch and electrically coupled by the protection block to the intermediate node, the isolation block including:
    - a diode block electrically coupled between said input and output terminals of the low voltage isolation switch;
    - a control transistor electrically coupled across said diode block and having a control terminal electrically coupled to said intermediate node by said protection block; and
    - a voltage limiter block coupled between the input terminal of the low voltage isolation switch and the control terminal of the control transistor.

9. The transmission channel according to claim 8, comprising:
- a low voltage terminal;
- a transconductance cell having an input electrically coupled to the low voltage terminal; and
- a transmission switch electrically coupled between said connection terminal and said low voltage terminal.

10. The transmission channel according to claim 8, wherein said voltage limiter block comprises a first and second voltage limiters electrically coupled between the input terminal of the low voltage isolation switch and the control terminal of the control transistor.

11. The transmission channel according to claim 8, wherein said diode block includes a first transmission diode having a cathode terminal electrically coupled to said output terminal of the low voltage isolation switch and an anode terminal electrically coupled to said input terminal of the low voltage isolation switch and a second transmission diode having an anode terminal electrically coupled to said output terminal of the low voltage isolation switch and a cathode terminal electrically coupled to said input terminal of the low voltage isolation switch.

12. The transmission channel according to claim 8, wherein said control transistor is a low voltage diode-configured N channel MOS transistor.

13. The transmission channel according to claim 8, wherein said protection block includes:
- a first protection transistor having a control terminal configured to receive a first protection driving signal; and
- a second protection transistor electrically coupled in anti-series with the first protection transistor and having a control terminal configured to receive a second protection driving signal.

14. The transmission channel according to claim 8, wherein said protection block includes an N channel MOS transistor and a P channel MOS transistor electrically coupled in anti-series with each other.

15. The transmission channel according to claim 8, wherein:
- said driving block includes an inverting level shifter configured to produce an inverted first driving signal by inverting a first driving signal;

said first driving transistor of said driving block has a control terminal configured to receive the inverted first driving signal; and said second driving transistor has a control terminal configured to receive a second driving signal.

16. A driving method for driving a transmission channel, comprising:

transmitting a high voltage signal via a connection terminal to a load, the transmitting including:

receiving the high voltage signal at an input terminal;

turning on a matrix of high voltage switches of the transmission channel, the matrix being electrically coupled between the input terminal and a high voltage terminal;

transmitting the high voltage signal through the matrix;

transmitting said high voltage signal through a low voltage isolation switch that includes a driving block, having first and second driving transistors coupled to each other by a first intermediate node; a protection block; and an isolation block electrically coupled between the protection block and the output terminal and electrically coupled by the protection block to the intermediate node, the isolation block including a diode block electrically coupled between said high voltage terminal and an output terminal, a control transistor electrically coupled across said diode block and having a control terminal electrically coupled to said first intermediate node by said protection block, and a voltage limiter block coupled between the high voltage terminal and the control terminal of the control transistor.

17. The driving method according to claim 16, comprising blocking a high voltage signal from reaching the driving circuit by keeping said protection block off while transmitting said high voltage signal through the low voltage isolation switch, said control terminal of said control transistor being left floating.

18. The driving method according to claim 16, comprising:

producing an inverted first driving signal at a negative low supply voltage value using a level shifter that inverts a first driving signal that is at a positive low supply voltage value;

driving the first driving transistor with the inverted first driving signal at the negative low supply voltage value during transmitting said high voltage signal through the low voltage isolation switch; and driving said second driving transistor with a second driving signal at said positive low supply voltage value during transmitting said high voltage signal through the low voltage isolation switch.

19. The driving method according to claim 16, comprising a first receiving mode that includes:

turning off said matrix of high voltage switches and said low voltage isolation switch;

turning on a transmission switch coupled between the connection terminal and a transconductance cell;

receiving a first echo signal at the connection terminal; and transmitting said first echo signal from said connection terminal through said transmission switch to said transconductance cell.

20. The driving method according to claim 19, comprising, during said first receiving mode:

keeping said protection block on by keeping the intermediate node at a negative low supply voltage value, applying a ground value to a gate of an NMOS first protection transistor, applying a negative supply voltage value that is twice as much as the negative low supply voltage value to a gate of a PMOS second protection transistor, so as to bring said control terminal of said control transistor to the negative low supply voltage value.

21. The driving method according to claim 19, comprising a second receiving mode that includes:

turning on said matrix of high voltage switches and said low voltage isolation switch;

turning off the transmission switch;

receiving a second echo signal at the connection terminal; and transmitting said second echo signal from said connection terminal through the low voltage decoupling block and said matrix of switches to said input terminal.

22. The driving method according to claim 19, comprising, during said second receiving step:

keeping turned on said control transistor, said protection block, and said first driving transistor;

keeping said second driving transistor turned off; and keeping said transmission switch open so that said second echo signal reaches said matrix of switches through said control transistor.

* * * * *